United States Patent
Ashizawa et al.

(10) Patent No.: US 7,656,468 B2
(45) Date of Patent: Feb. 2, 2010

(54) DISPLAY DEVICE AND MANUFACTURING METHOD OF THE DISPLAY DEVICE

(75) Inventors: Keiichirou Ashizawa, Mobara (JP); Tsutomu Kasai, Mobara (JP); Masafumi Hirata, Ooamishirasato (JP)

(73) Assignee: Hitachi Displays, Ltd., Chiba (JP)

( * ) Notice: Subject to any disclaimer, the term of this patent is extended or adjusted under 35 U.S.C. 154(b) by 573 days.

(21) Appl. No.: 11/473,265

(22) Filed: Jun. 23, 2006

(65) Prior Publication Data

US 2007/0002200 A1 Jan. 4, 2007

(30) Foreign Application Priority Data

Jun. 30, 2005 (JP) ............... 2005-191364

(51) Int. Cl.
G02F 1/1333 (2006.01)
G02F 1/1368 (2006.01)
(52) U.S. Cl. ......................... 349/43; 349/187
(58) Field of Classification Search ............ 349/42, 349/43, 122, 138, 139, 187; 438/30; 257/59, 257/72
See application file for complete search history.

(56) References Cited

U.S. PATENT DOCUMENTS

| 5,479,052 A | * | 12/1995 | Yuuki | ............ | 257/745 |
| 7,271,867 B2 | | 9/2007 | Kim et al. | | |
| 7,335,912 B2 | * | 2/2008 | Park et al. | ............ | 257/59 |
| 2004/0066485 A1 | * | 4/2004 | Shiota | ............ | 349/187 |
| 2005/0116630 A1 | * | 6/2005 | Kim et al. | ............ | 313/506 |
| 2006/0145161 A1 | * | 7/2006 | Lee et al. | ............ | 257/72 |

FOREIGN PATENT DOCUMENTS

| CN | 1575525 A | 2/2002 |
| JP | 11-326949 | 5/1998 |
| WO | WO 03/036728 A1 | 2/2002 |

OTHER PUBLICATIONS

Office Action from the Chinese Patent Office dated Jan. 9, 2009 in Chinese.

* cited by examiner

Primary Examiner—Dung Nguyen
Assistant Examiner—Tai Duong
(74) Attorney, Agent, or Firm—Stites & Harbison PLLC; Juan Carlos A. Marquez, Esq.

(57) ABSTRACT

The present invention enhances a manufacturing yield rate relating to through holes. In a display device which includes a first conductive layer formed on a substrate and a second conductive layer which is formed on the first conductive layer by way of insulation films of two or more layers and connects the first conductive layer and the second conductive layer via a through hole, in the through hole portion, a side surface of an opening formed in the insulation film arranged on the first conductive layer side out of the insulation films of two or more layers includes a portion thereof which is covered with the insulation film arranged on the second conductive layer side out of the insulation films of two or more layers and an exposed portion.

7 Claims, 9 Drawing Sheets

DISPLAY DEVICE AND MANUFACTURING METHOD OF THE DISPLAY DEVICE

BACKGROUND OF THE INVENTION

1. Field of the Invention

The present invention relates to a display device and a manufacturing method of the display device.

2. Description of the Related Art

Through holes are used in various electronic devices. As an example, in a display device, the through hole is used as a connecting portion between a source electrode of a TFT (Thin Film Transistor) and a pixel electrode. An insulation film of one layer or two or more layers is formed between the source electrode and the pixel electrode, and the pixel electrode and the source electrode are connected with each other via a through hole formed in the insulation film (see JP-A-11-326949, for example).

Above-mentioned JP-A-11-326949 discloses, in a state that the insulation film is formed of two layers, a case in which an opening formed in the upper-layer insulation film is smaller than an opening formed in the lower-layer insulation film at a through hole portion (see FIG. 8 in JP-A-11-326949) and a case in which the opening formed in the upper-layer insulation film is larger than the opening in the lower-layer insulation film at the through hole portion (see FIG. 3 in JP-A-11-326949) respectively.

By forming the insulation film in two layers, it is possible to obtain an advantage that the insulation properties of the lower layer and the upper layer of the insulation layer can be enhanced. And hence, the technique is effective for enhancing an image quality due to the reduction of a parasitic capacitance or the reduction of a short circuiting defect.

However, it has been found out that the constitution which includes the multi-layered insulation film in the through hole portion eventually may fail to enhance the yield rate. Inventors of the present invention have studied causes and have found out the followings.

(A) When the opening formed in the upper-layer insulation film is larger than the opening formed in the lower-layer insulation film in the through hole portion as shown in FIG. 3 of JP-A-11-326949, a stepped portion or an edge is formed on the side surface of the through hole structurally. Accordingly, it has been found that the above-mentioned pixel electrode is liable to be easily disconnected by the stepped portion or the edge thus bringing about the lowering of the yield rate.

(B) When the opening formed in the upper-layer insulation film is smaller than the opening formed in the lower-layer insulation film in the through hole portion as shown in FIG. 8 of JP-A-11-326949, only the upper-layer insulation film is exposed on the side surface of the through hole and hence, the stepped portion or the edge is reduced whereby the lowering of the yield rate can be suppressed. However, when the constitution shown in FIG. 8 of JP-A-11-326949 is adopted, it has been found out that in spite of the realization of contact between the source electrode and the pixel electrode structurally, the electrical connection becomes insufficient and point defects frequently occur.

Accordingly, the inventors of the present invention have found out that in either one of these constitutions, even when the short-circuiting defect is lowered, new causes which generate the lowering of the yield rate are newly generated.

SUMMARY OF THE INVENTION

It is an object of the present invention to provide a technique which can improve a yield rate while having a through hole portion which is formed through an insulation film of two or more layers.

The above-mentioned and other objects of the present invention and novel features of the present invention will become apparent from the description of this specification and attached drawings.

To explain the summary of the inventions disclosed in this specification, they are as follows.

(1) In a display device which includes a first conductive layer formed on a substrate and a second conductive layer which is formed on the first conductive layer by way of insulation films of two or more layers and connects the first conductive layer and the second conductive layer via a through hole, in the through hole portion, a side surface of an opening formed in the insulation film arranged on the first conductive layer side out of the insulation films of two or more layers includes a portion thereof which is covered with the insulation film arranged on the second conductive layer side out of the insulation films of two or more layers and an exposed portion.

(2) The display device is, in the above-mentioned means (1), characterized in that an outer circumference of a bottom surface of the opening formed in the insulation film arranged on the first conductive layer side and an outer circumference of the insulation film arranged on the second conductive layer side intersect each other.

(3) The display device is, in the above-mentioned means (1) or (2), characterized in that the substrate is constituted of a substrate which includes a plurality of pixels, and the second conductive layer is constituted of pixel electrodes.

(4) The display device is, in the above-mentioned any one of means (1) or (3), characterized in that the insulation film arranged on the first conductive layer side and the insulation film arranged on the second conductive layer side are made of materials different from each other.

(5) The display device is, in the above-mentioned means (4), characterized in that the insulation film arranged on the first conductive layer side is formed of an inorganic insulation film and the insulation film arranged on the second conductive layer side is formed of an organic insulation film.

(6) In a manufacturing method of a display device which includes a step in which an insulation film is formed on the first conductive layer which is formed on a substrate, and a step in which a second conductive layer is formed on the insulation film and connects the first conductive layer and the second conductive layer via an opening portion formed in the insulation film, the step which forms the insulation film is constituted of a step in which a first insulation film having a first opening portion is formed in the first conductive layer, and a step in which a second insulation film having a second opening portion is formed over the first insulation film in a state that the second opening portion includes a portion which covers a side surface of the first opening portion and an exposed portion.

(7) The manufacturing method of the display device is, in the above-mentioned means (6), characterized in that the first opening portion is formed by dry etching.

(8) The manufacturing method of the display device is, in the above-mentioned means (7), characterized in that the step which forms the second insulation film having the second opening portion is constituted of a step which applies or prints a material of the second insulation film and a step which forms an opening thereafter.

When the through hole portion includes the insulation films of two layers, the conductive layer which is arranged below the lower-layer insulation layer receives damages by etching twice at the time of etching the first insulation layer and at the time of etching the second insulation layer thus bringing about the surface roughness and the degeneration of the conductive layer. Accordingly, the connection resistance of the through hole portion is increased. Accordingly, the constitution having the multi-layered insulation layers is liable to easily generate a connection defect fundamentally compared to the constitution having the single-layered insulation layer.

Upon studying the behavior of the insulation layer at the time of etching the insulation films, the inventors of the present invention have found out that side surfaces of the insulation films are retracted simultaneously with the progress of etching, that is, the etching progresses such that a shape of the through hole is gradually enlarged. Accordingly, the time in which an outer circumferential portion of the through hole is substantially exposed to etching becomes short and the damages on the conductive layer attributed to etching are lowered on an outermost circumferential portion of the through hole. Further, the inventors of the present invention have found out that it is effective to bring the upper-layer conductive layer and the lower-layer conductive layer into contact with each other at this outer circumferential portion for the reduction of the contact resistance.

To study the above-mentioned constitutions (A), (B) based on the above-mentioned findings, following results are obtained.

First of all, in the constitution (A), the outermost circumferential portion of the through hole formed in the lower-layer insulation film can be used for contact and hence, the generation of a contact defect attributed to the increase of connection resistance can be eliminated. However, the connection defect attributed to the disconnection is liable to be easily generated.

Further, in the constitution (B), since the outermost circumferential portion of the through hole formed in the lower-layer insulation layer is not used for contact, the connection defect attributed to the increase of the connection resistance is liable to be easily generated. However, it is possible to eliminate the connection defect attributed to the disconnection.

Accordingly, either one of the constitutions (A), (B) possesses the causes which lower a yield rate. The present invention has succeeded in eliminating these causes which lower the yield rate through the clarification of causes which generate the lowering of the yield rate.

That is, according to the display device of the present invention, as in the case of the above-mentioned means (1), a portion of the side surface of the opening formed in the first insulation film on the first conductive layer side is exposed in the through hole and a remaining portion of the side surface is covered with the second insulation film on the second conductive layer side. Accordingly, it is possible to, for the first time, prevent the disconnection of the second conductive layer in the through hole portion while realizing the contact on the outer circumferential portion thus realizing the elimination of causes which lower the yield rate structurally.

In other words, as in the case of the means (2), the outer circumference of the bottom surface of the opening formed in the first insulation film and the outer circumference of the bottom surface of the opening formed in the second insulation film intersect each other. In such a display device, when the first conductive layer and the second conductive layer are connected to each other via the through hole, for example, the connection is performed by the manufacturing method described in the means (6). Here, the opening formed in the first-layer insulation film is formed by dry etching as in the case of the means (7) and hence, the surface of the first conductive layer which is exposed on the bottom surface of the opening formed in the first-layer insulation film becomes rough. However, the roughness of the surface is relatively small on the outer circumferential portion of the exposed surface of the first conductive layer. Accordingly, by partially exposing the outer circumferential portion with small surface roughness, it is possible to suppress a connection defect between the first conductive layer and the second conductive layer and the increase of the contact resistance.

Further, when the opening is formed in the first insulation film by dry etching, an edge is generated on the side surface of the opening. However, for example, by forming the second insulation film by coating or printing as in the case of the means (8), it is possible to obtain the smooth side surface of the opening which covers the first insulation film. Accordingly, it is possible to reduce the possibility that the second conductive layer is disconnected by the edge of the first insulation film.

Further, the second conductive layer is, for example, constituted of the pixel electrodes as in the case of the means (4), while the first conductive layers are, for example, constituted of source electrodes of TFT elements.

BRIEF DESCRIPTION OF THE DRAWINGS

Hereinafter, the present invention is explained in detail in conjunction with embodiments by reference to drawings.

Here, in all drawings for explaining the embodiments, parts having identical functions are given same symbols and their repeated explanation is omitted.

DESCRIPTION OF THE PREFERRED EMBODIMENTS

The present invention aims at the enhancement of a yield rate of an electric equipment which forms a multi-layered insulation film between a lower conductive layer and an upper conductive layer and connects the lower conductive layer and the upper conductive layer via a through hole. As an example, in a display device, for example, when a source electrode of a TFT element and a pixel electrode are connected via a through hole, a portion of a side surface of an opening of a first insulation film which is arranged close to the source electrode is covered with a second insulation film which is arranged close to the pixel electrode. Due to such a constitution, the increase of a contact resistance between the source electrode and the pixel electrode is suppressed and a possibility of disconnection of the pixel electrode on the side surface of the opening is reduced.

Embodiment

Figure 1:
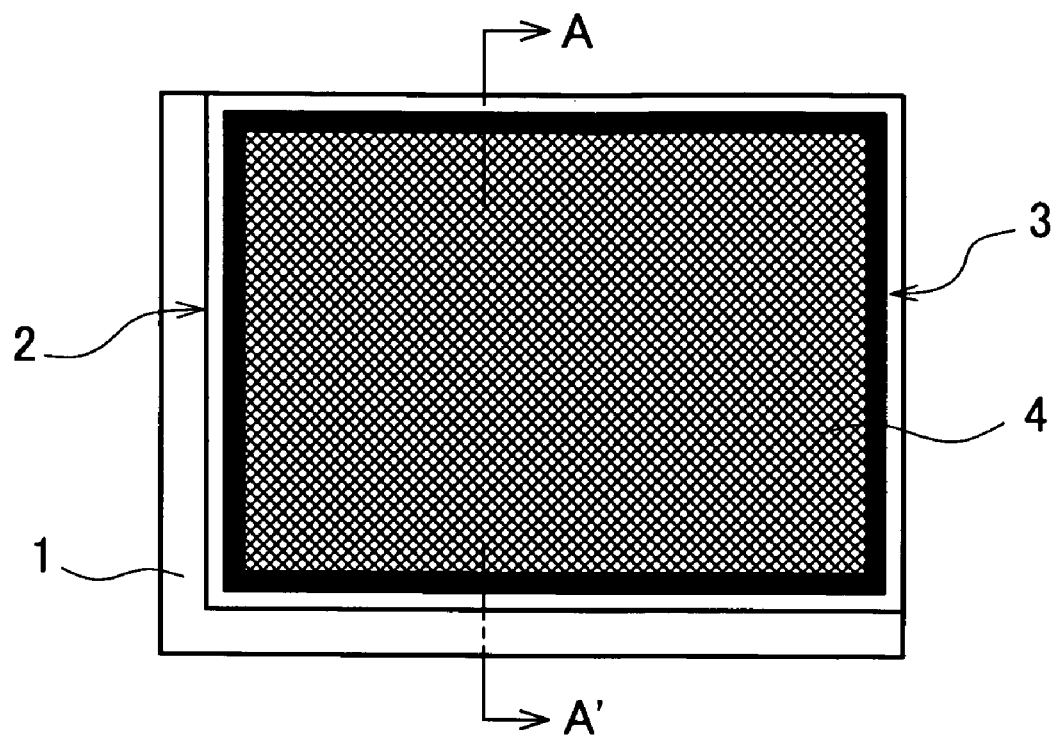
FIG. 1 is a plan view showing the schematic constitution of a display panel.
Figure 2:
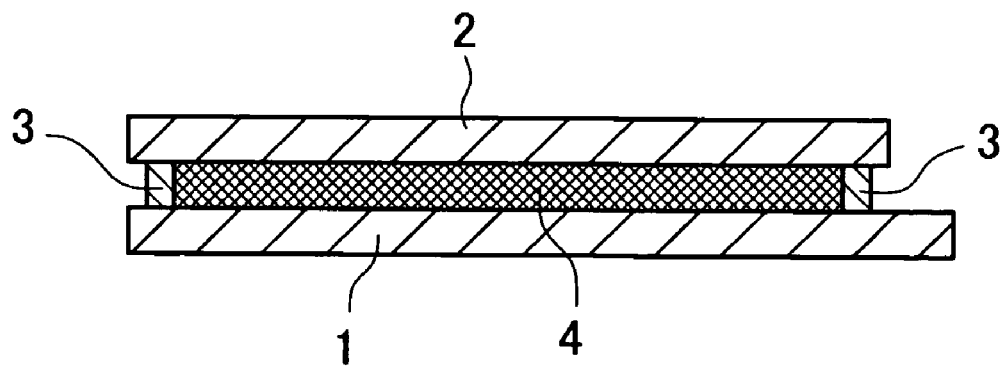
FIG. 2 is a schematic view showing the schematic constitution of a liquid crystal display panel, and is also a cross-sectional view taken along a line A-A' in FIG. 1.
Figure 3:
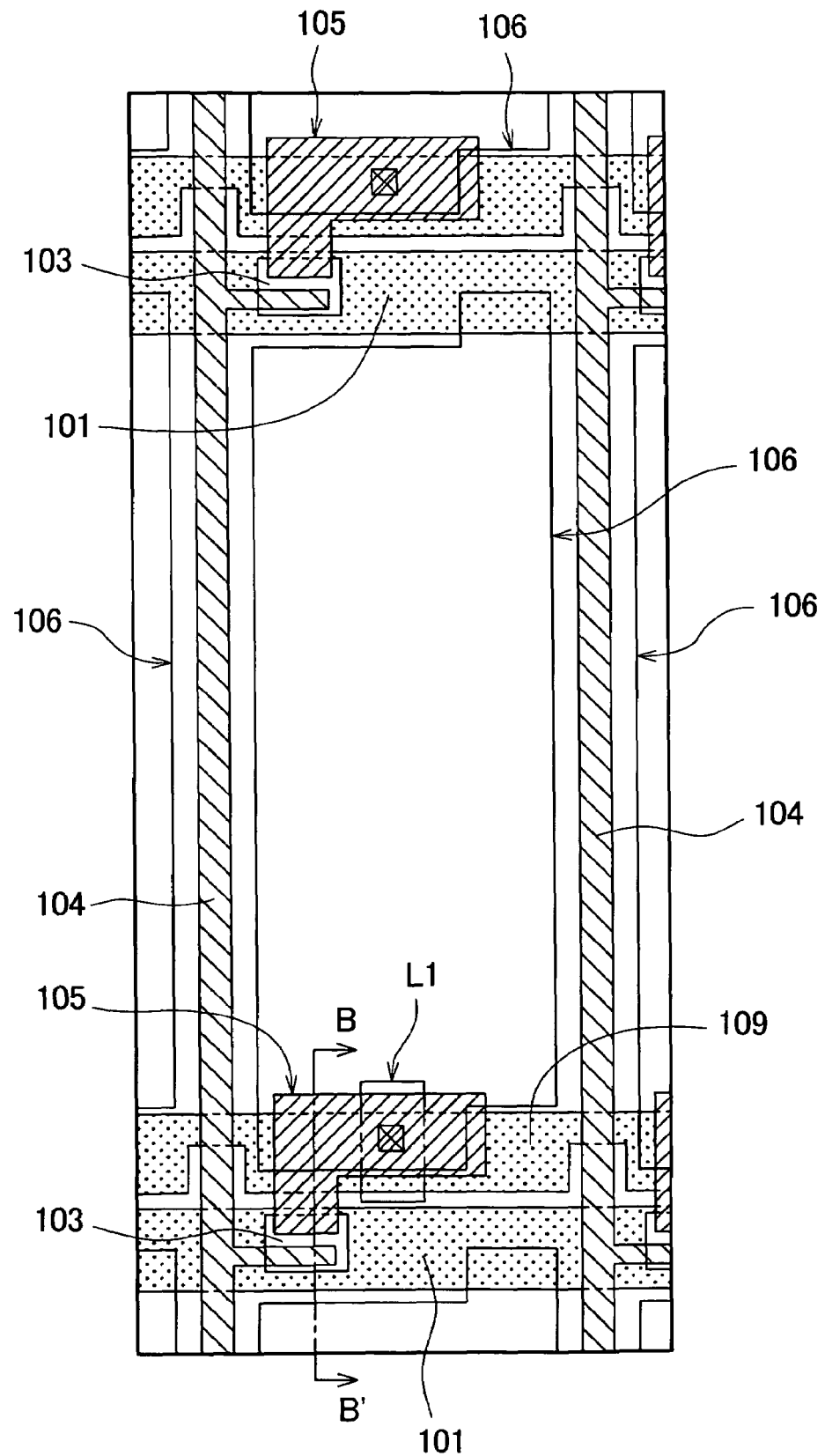
FIG. 3 is a schematic view showing the schematic constitution of a liquid crystal display panel of one embodiment according to the present invention, and also is a plan view showing a constitutional example of one pixel.
Figure 4:
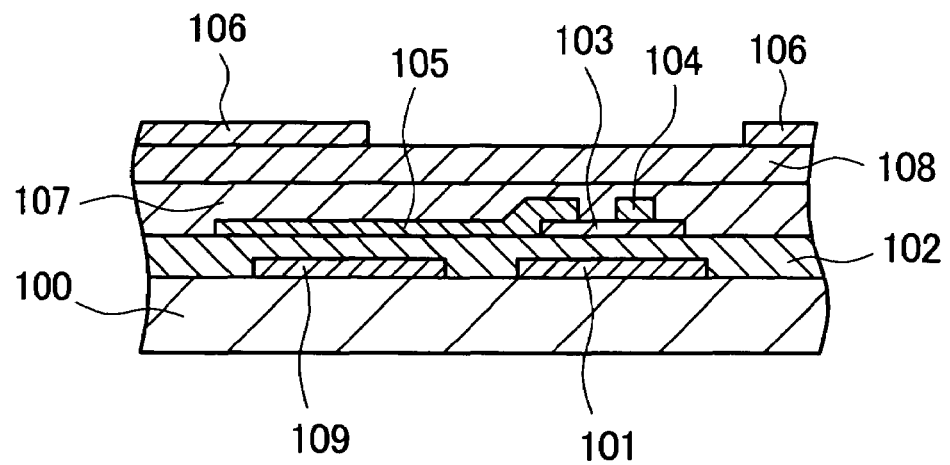
FIG. 4 is a cross-sectional view taken along a line B-B' in FIG. 3.
Figure 5:
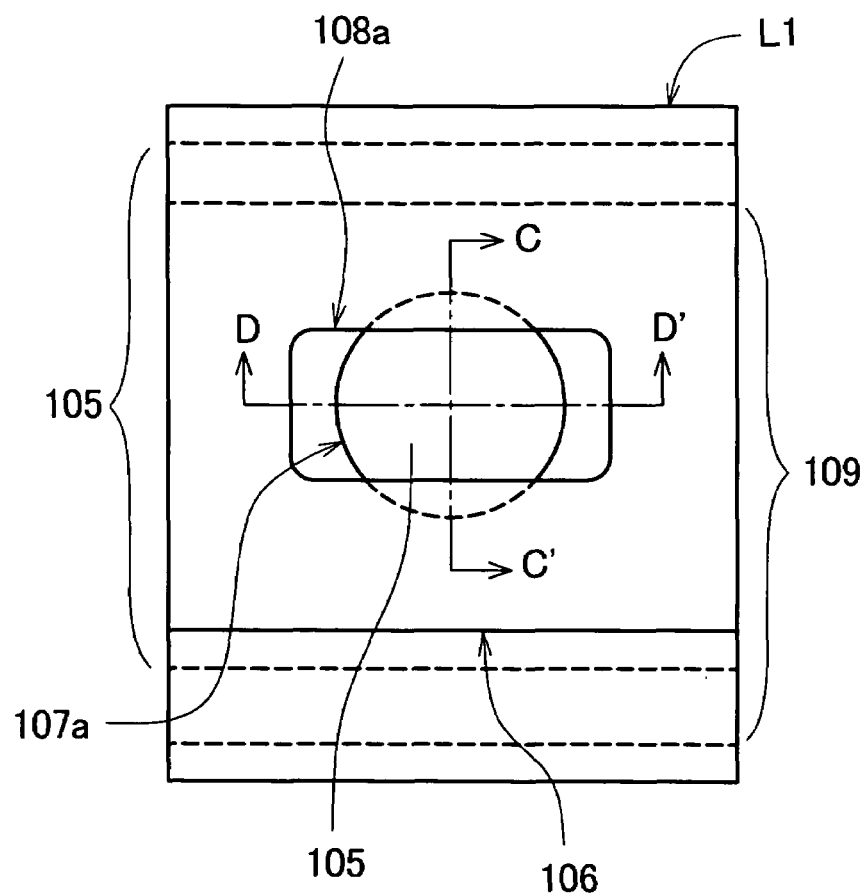
FIG. 5 is an explanatory view of one part of a region L1 in FIG. 3.
Figure 6:
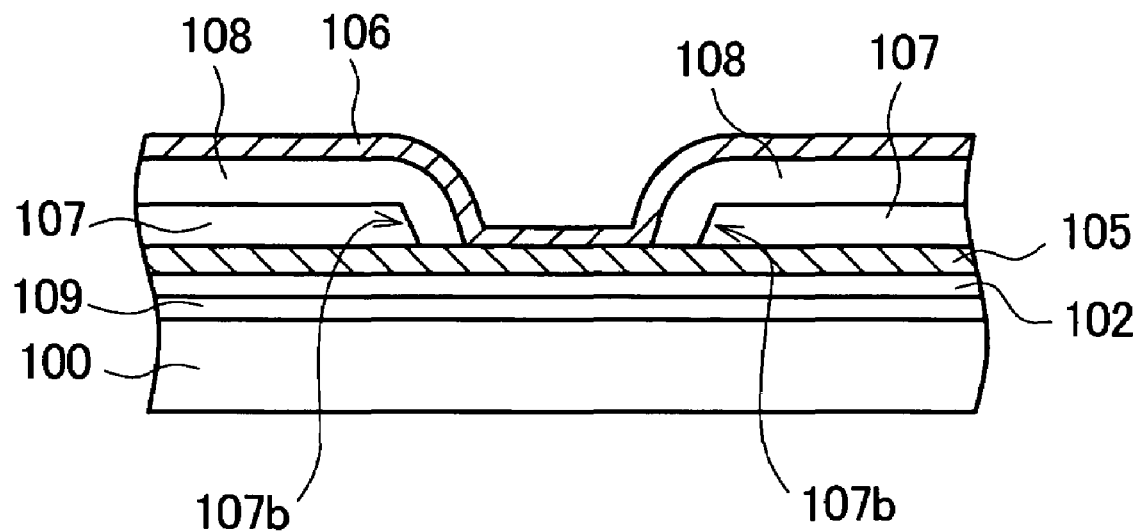
FIG. 6 is a cross-sectional view taken along a line C-C' in FIG. 5.
Figure 7:
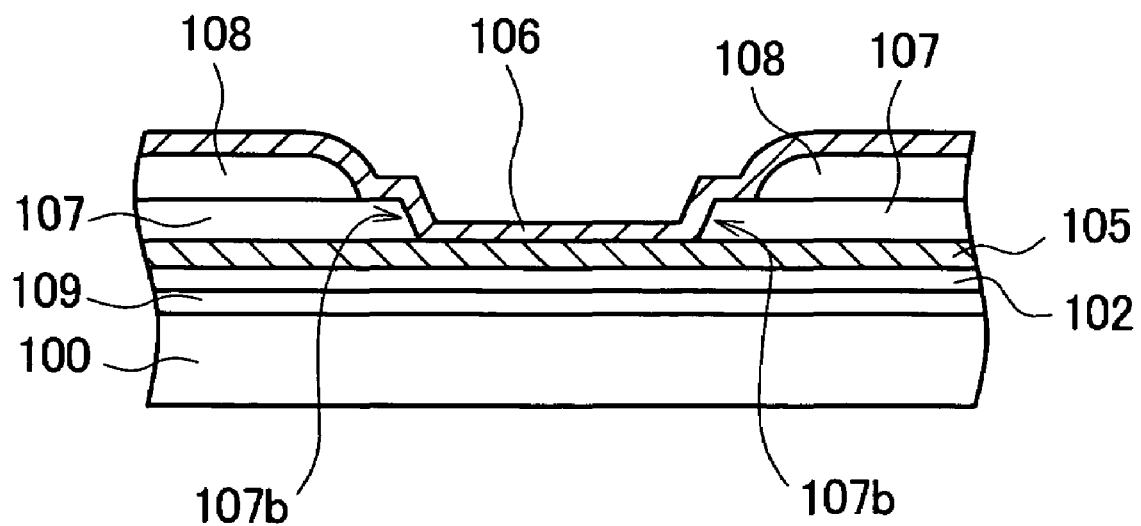
FIG. 7 is a cross-sectional view taken along a line D-D' in FIG. 5.

FIG. 1 is a plan view showing the schematic constitution of a liquid crystal display panel, FIG. 2 is a cross-sectional view taken along a line A-A' in FIG. 1, FIG. 3 is a plan view showing a constitutional example of one pixel, FIG. 4 is a cross-sectional view taken along a line B-B' in FIG. 3, FIG. 5 is a schematic plan view showing a region L1 in FIG. 3, FIG. 6 is a cross-sectional view taken along a line C-C' in FIG. 5 and FIG. 7 is a cross-sectional view taken along a line D-D' in FIG. 5.

In FIG. 1 and FIG. 2, numeral 1 indicates a substrate (TFT substrate), numeral 2 indicates another substrate (counter substrate), numeral 3 indicates a sealing member, and numeral 4 indicates a liquid crystal material. Further, in FIG. 3 to FIG. 7, numeral 100 indicates a substrate, numeral 101 indicates gate lines, numeral 102 indicates a first insulation film, numeral 103 indicates an amorphous silicon film, numeral 104 indicates drain lines, numeral 105 indicates source electrodes, numeral 106 indicates pixel electrodes, numeral 107 indicates a second insulation film, numeral 108 indicates a third insulation film and numeral 109 indicates holding capacitance lines.

The display device of this embodiment is a display device which uses a liquid crystal display panel. As shown in FIG. 1 and FIG. 2, two substrates 1, 2 are adhered to each other using an annular sealing member 3 and a liquid crystal material 4 is filled between two substrates 1, 2. The liquid crystal display panel is used as a display device such as a liquid crystal display for a liquid crystal television receiver set or for a PC (Personal Computer) or a display of a notebook type PC or a display of a mobile phone terminal, for example.

In the liquid crystal display panel, one substrate 1 out of the two substrates 1, 2 is a TFT substrate on which switching elements such as TFT elements are arranged in a matrix array, while another substrate 2 is a counter substrate on which a color filter and the like are mounted.

Here, the TFT element of the TFT substrate 1 includes, as shown in FIG. 3 and FIG. 4, the gate line 101 which is formed on the transparent substrate 100 such as a glass substrate, an amorphous silicon film 103 which is formed on the gate line 101 by way of the first insulation film 102, the drain line 104 and the source electrode 105. Further, the gate lines 101 extend in the horizontal direction on the paper surface and a plurality of the gate lines 101 are arranged in the vertical direction on the paper surface. A plurality of drain lines 104 extend in the vertical direction on a paper surface and are arranged in parallel in the horizontal direction on the paper surface. Further, a region surrounded by the gate lines 101 and the drain lines 104 corresponds to one pixel and, for example, the TFT element is arranged in each region at a rate of one TFT element per one region.

Further, in the region surrounded by the gate lines 101 and the drain lines 104, for example, the pixel electrode (transparent electrode) 106 made of ITO is formed. Here, the pixel electrode 106 is, for example, formed on a conductive layer on which the source electrode 105 and the like are mounted by way of two-layered protective insulation films consisting of the second insulation film 107 and the third insulation film 108. Further, the pixel electrode 106 is connected to the source electrode 105 via a through hole.

The connection portion of the source electrode 105 and the pixel electrode 106 is schematically shown as a region indicated by L1 in FIG. 3. The structure of the region L1 is explained in more detail. FIG. 5 is a plan view of an example of the detailed structure of the through hole. FIG. 6 is a schematic cross-sectional structure taken along a line C-C' in FIG. 5 and FIG. 7 is a schematic cross-sectional structure taken along a line D-D' in FIG. 5. In the display device of this embodiment, the source electrode 105 is partially exposed through openings formed in the second insulation film 107 and the third insulation film 108 which are formed on the source electrode 105 and is electrically connected to the pixel electrode 106. Here, an outer circumference 107a of a bottom surface of the opening of the second insulation film 107 which is arranged on a source electrode 105 side and an outer circumference 108a of a bottom surface of the opening of the third insulation film 108 which is arranged on a pixel electrode 106 side intersect each other as shown in FIG. 5. That is, a side surface of the opening 107b of the second insulation film 107 includes a portion which is covered with the third insulation film 108 as shown in FIG. 6 and a portion which is exposed and is brought into contact with the pixel electrode 106 as shown in FIG. 7 in a mixed form. Here, in FIG. 5, the exposed portion of the second insulation film 107 extends in two directions, that is, in the upper and lower directions and the covered portion of the second insulation film 107 extends in two directions, that is, in the left and right directions. However, it is sufficient that at least the exposed portion is formed in one direction and the covered portion is formed in one direction. However, by forming the exposed portion and the covered portion in a large number of directions, the redundancy is enhanced. Further, by allowing the outer circumference 107a and the outer circumference 108a to intersect each other, even when there may be some misalignment, it is possible to surely realize the constitution which includes both of the exposed portion and the intersect portion and hence, the mass productivity is enhanced.

Here, the concept explained above is applicable to the display device other than the liquid crystal display device, for example, an EL (Electroluminescence) display, a PDP (Plasma Display Panel), an FED (Field Emission Display) or the like. Further, the constitution is not limited to the display device and is applicable to an electronic device in general which performs the connection via through holes. This embodiment is applicable to a case in which two-layered insulation films are formed between the lower conductive layer and the upper conductive layer and a through hole is formed in these two-layered insulation films.

Further, the second insulation film 107 and the third insulation film 108 may be formed of the same material. In this case, the collective etching of the second insulation film and the third insulation film does not fall within the scope of the present invention. This is because that the through hole is continuously and concentrically formed in the second insulation film and the third insulation film and hence, there arises no task which the present invention intends to overcome.

However, when the through hole of the second insulation film 107 and the through hole of the third insulation film 108 are formed in the different steps, there arises a problem which the present invention intends to overcome and hence, the shapes of the through holes according to the present invention are effectively applicable to these through holes.

Further, when the second insulation film 107 and the third insulation film 108 are formed of different materials, even when the second insulation film 107 and the third insulation film 108 are collectively etched, a stepped portion is generated due to the difference in an etching rate. Accordingly, the application of the through hole shape of the present invention is effective.

Further, FIG. 5 to FIG. 7 show the case in which the insulation layer is formed of two layers. However, even when the insulation layer is formed of three or more layers, the through hole shape of the present invention is applicable to such layer structure in the same manner. Here, in this case, to obtain the advantageous effects of the present invention, it is necessary to limit the number of etching of the insulation layer to two times at maximum. Accordingly, when the insulation layer is formed of three layers or more, a plurality of insulation layers may be performed collectively.

Figure 8:
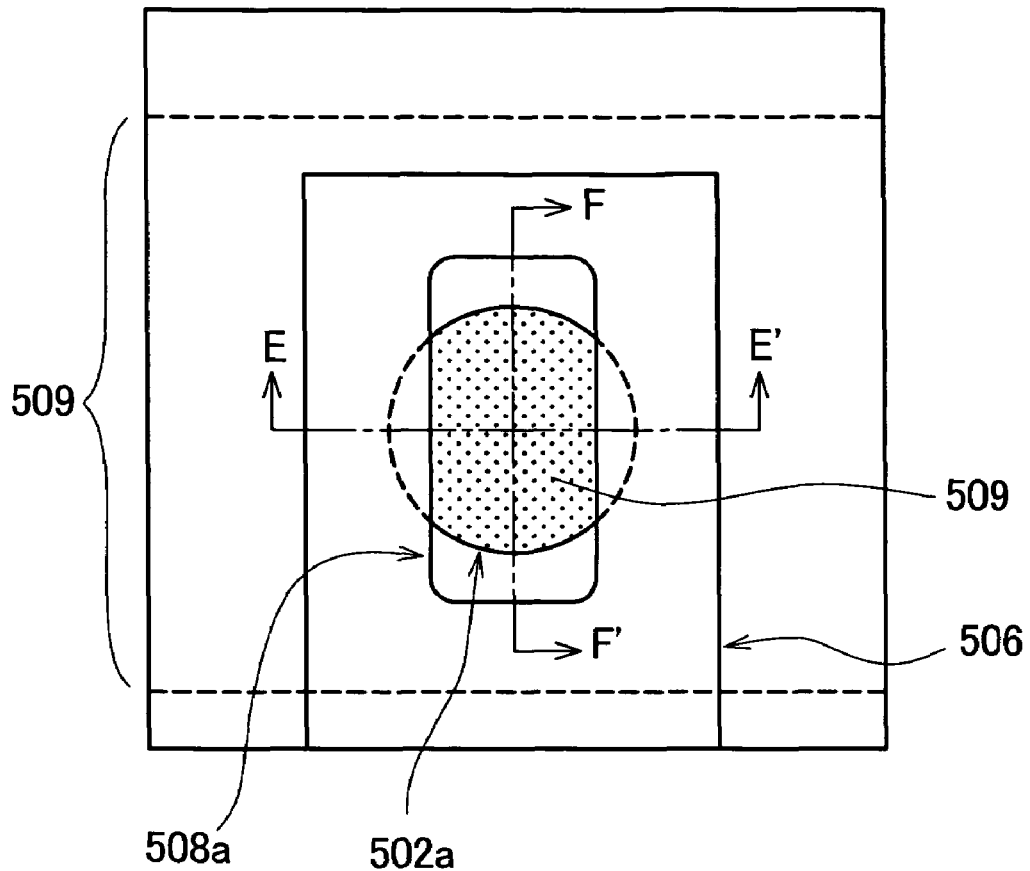
FIG. 8 is a schematic plan view showing the schematic constitution of one example according to the present invention.
Figure 9:
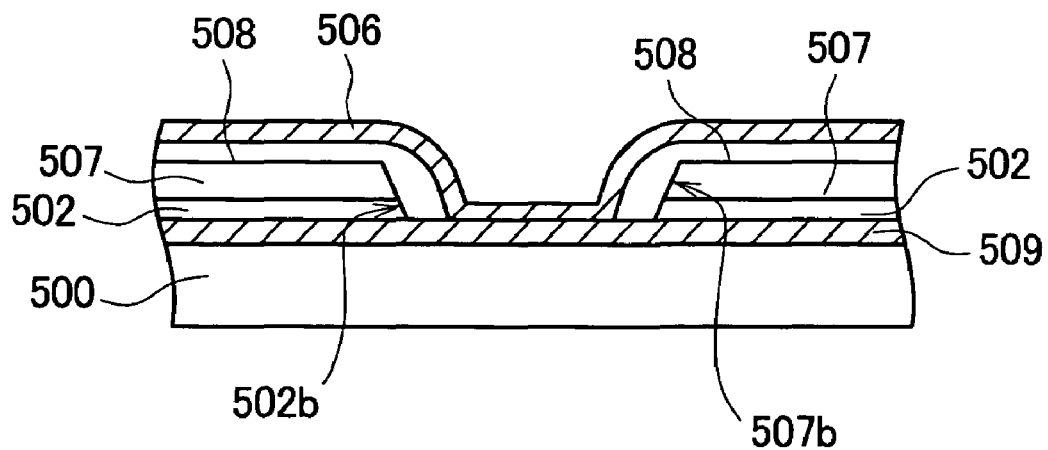
FIG. 9 is a cross-sectional explanatory view taken along a line E-E' in FIG. 8.
Figure 10:
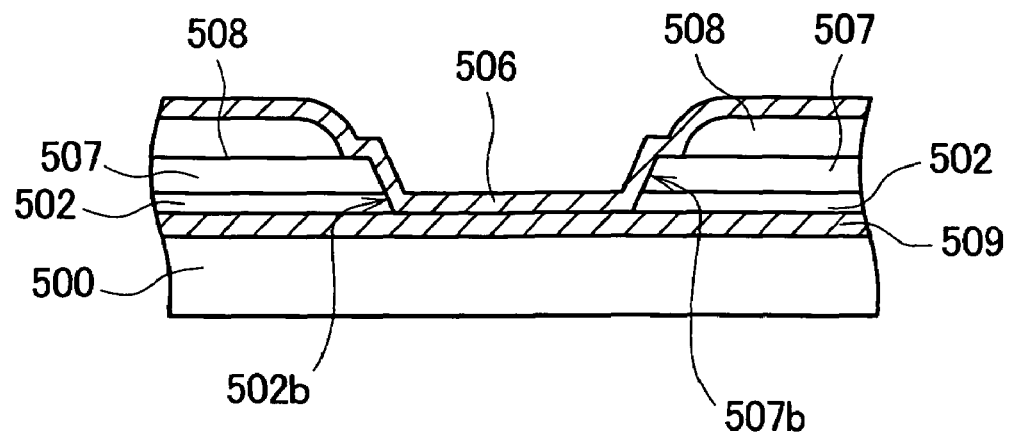
FIG. 10 is a cross-sectional explanatory view taken along a line F-F' in FIG. 8.

FIG. 8 is a plan view showing one example of the connection portion of the through holes in an electronic device having an insulation film formed of three layers or more. Further, FIG. 9 is a cross-sectional view taken along a line E-E' in FIG. 8 and FIG. 10 is a cross-sectional view taken along a line F-F' in FIG. 8. Further, in FIG. 8 to FIG. 10, numeral 500 indicates a substrate, numeral 509 indicates a lower conductive layer, numeral 506 indicates an upper conductive layer, numeral 502 indicates a first insulation film, numeral 507 indicates a second insulation film, and numeral 508 indicates a third insulation film. In this case, openings are formed in the first insulation film 502, the second insulation film 507 and the third insulation film 508 which are formed on the lower conductive layer 509, thus partially exposing the lower conductive layer 509. The lower conductive layer 509 is electrically connected to the upper conductive layer 506 of the exposed portion thereof. Here, an outer circumference 502a of a bottom surface of an opening of the first insulation film 502 which is arranged right above the lower conductive layer 509 and an outer circumference 508a of a bottom surface of the opening of the third insulation film 508 which is arranged right below the upper conductive layer 506 intersect each other as shown in FIG. 8. Further, here, side surfaces of the openings 502b, 507b of the first insulation film 502 and the second insulation film 507 respectively include a portion which is covered with the third insulation film 508 as shown in FIG. 9 and a portion which is exposed and is brought into contact with the upper conductive layer 506 as shown in FIG. 10 in a mixed form.

Here, the first insulation film 502 and the second insulation film 507 exhibit shapes which are continuously formed by collective etching. Here, to prevent the formation of a stepped portion between the first insulation film 502 and the second insulation film 507, it is necessary to form the first insulation film 502 and the second insulation film 507 using the same material (for example, both insulation films are formed of SiN).

Figure 11:
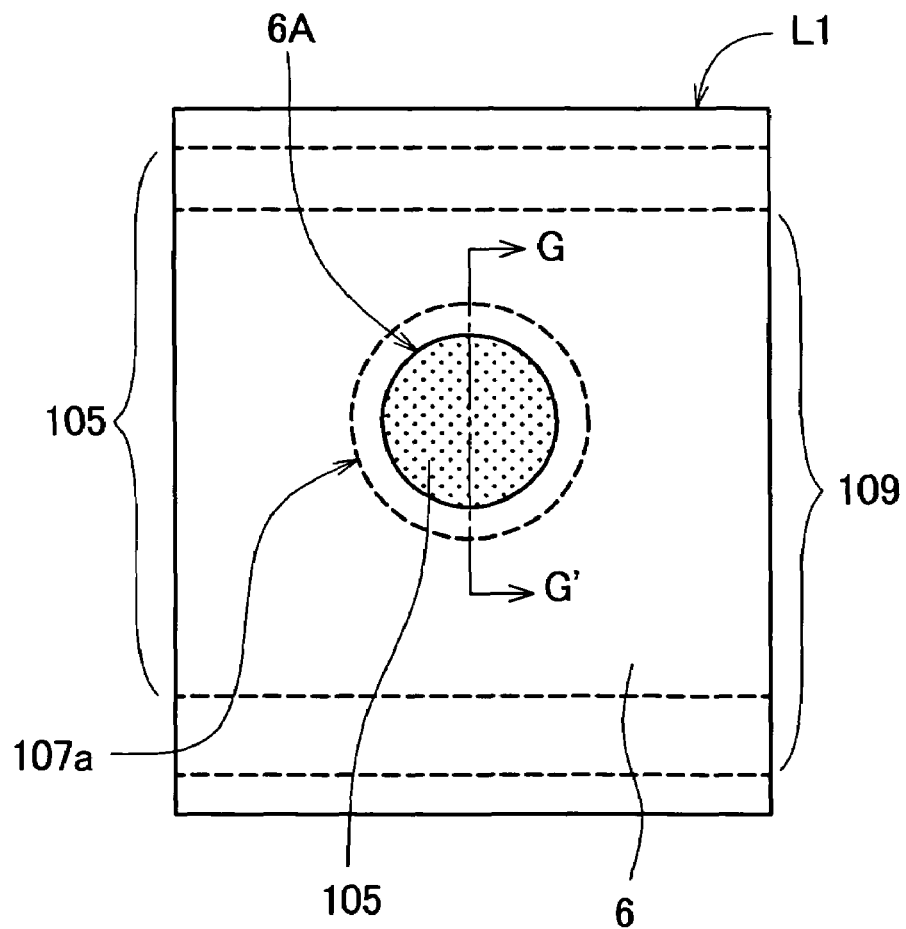
FIG. 11 is a schematic view for explaining a manufacturing method of the display panel according to the present invention, and also is an explanatory plan view of a step of forming an opening in a second insulation film.
Figure 12:
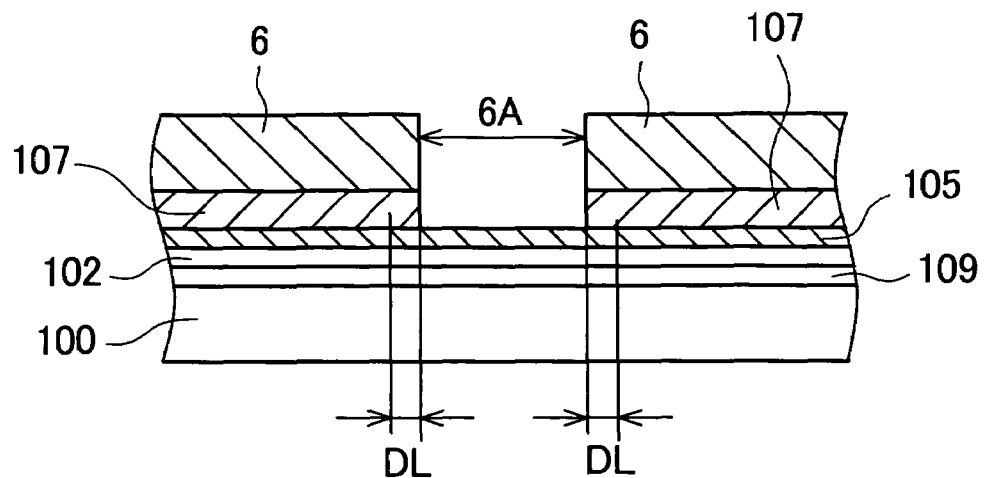
FIG. 12 is a cross-sectional view taken along a line G-G' in FIG. 11.
Figure 13:
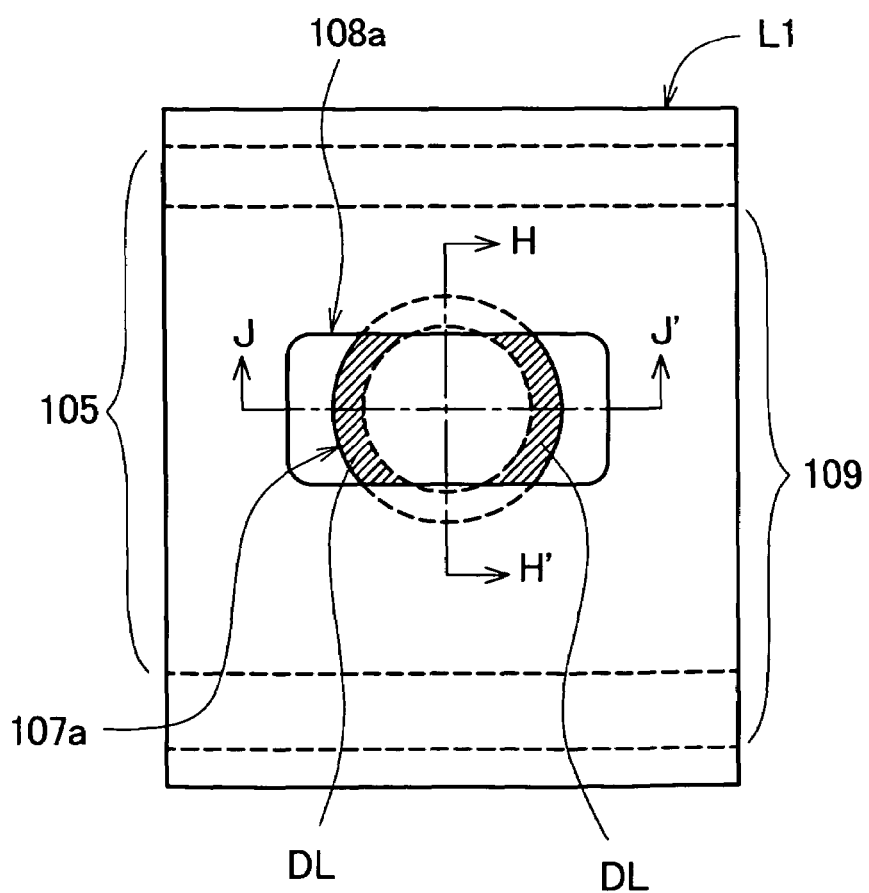
FIG. 13 is a schematic view for explaining a manufacturing method of the display panel according to the present invention, and also is an explanatory plan view of a step of forming an opening in a third insulation film.
Figure 14:
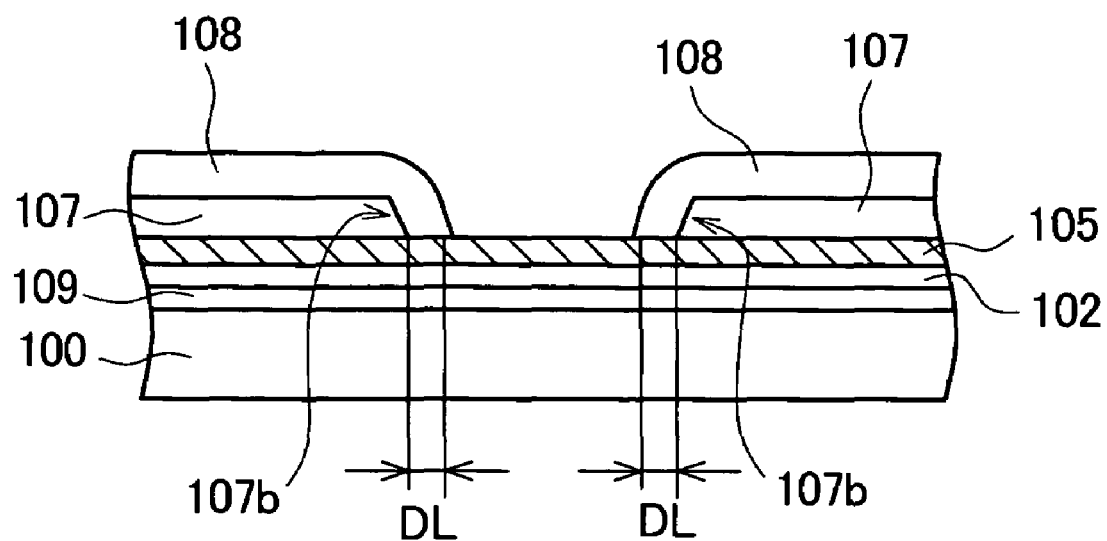
FIG. 14 is a cross-sectional view taken along a line H-H' in FIG. 13.
Figure 15:
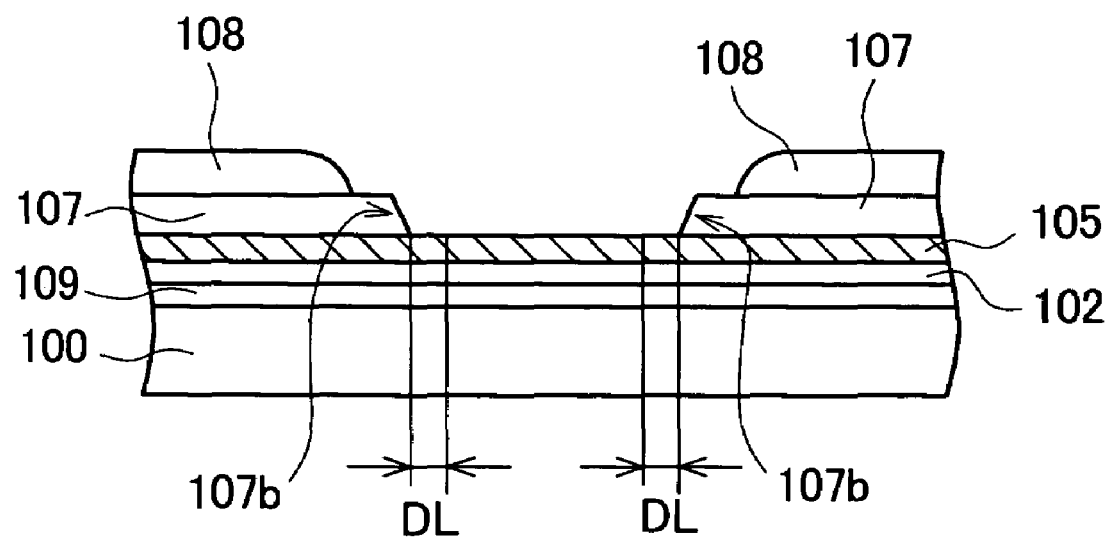
FIG. 15 is a cross-sectional view taken along a line J-J' in FIG. 13.

FIG. 11 to FIG. 15 are schematic views for explaining a manufacturing step of the through hole. The explanation is made with respect to a case in which the through hole shown in FIG. 5 is formed as an example. FIG. 11 is a plan view of a step for forming an opening in the second insulation film, FIG. 12 is a cross-sectional view taken along a line G-G' in FIG. 11, FIG. 13 is a plan view of a step for forming the third insulation film, FIG. 14 is a cross-sectional view taken along a line H-H' in FIG. 13, and FIG. 15 is a cross-sectional view taken along a line J-J' in FIG. 13.

First of all, on a surface of the substrate 100 such as glass substrate, the gate lines 101 and the holding capacitance lines 109 are formed. Next, after the first insulation film 102 is formed, the amorphous silicon film 103 is formed. Next, the drain lines 104 and the source electrodes 105 are formed. Further, over the amorphous silicon film 103, the drain lines 104 and the source electrodes 105, the second insulation film 107 is formed. The first insulation film 102 and the second insulation film 107 are formed of SiN, for example.

Next, an opening is formed in the second insulation film 107 on the source electrode 105. The opening forms a portion of the through hole for connecting the source electrode 105 and the pixel electrode 106 and is formed by dry etching, for example. The formation of the opening of the second insulation film 107 is explained in conjunction with FIG. 11 which is a plan view and FIG. 12 which is a cross-sectional view taken along a line G-G' in FIG. 11. First of all, over the second insulation film 107, an etching resist 6 in which an opening which defines an etching region 6A is formed is formed. A shape of the etching resist 6 is formed using a photolithography method, for example. Further, a portion of the second insulation film 107 which is exposed on a bottom surface of the opening of the etching resist 6 is removed by dry etching thus forming the opening in the second insulation film 107. Here, since isotropic etching is used as dry etching, as shown in FIG. 11 and FIG. 12, a portion of the second insulation film 107 which constitutes a region DL outside the opening region 6A formed in the etching resist 6 is also etched in a state that the second insulation film 107 retracts. As a result, the bottom surface of the opening of the second insulation film 107 becomes larger than the bottom surface of the opening of the etching resist 6.

The dry etching is performed as follows, for example. That is, a reactive gas such as SF6 is changed into plasma and is allowed to react with a portion of the second insulation film 107 which is exposed from the bottom surface of the opening thus removing the portion of the second insulation film 107. Here, since the source electrode 105 is sufficiently exposed on the bottom surface of the opening of the second insulation film 107, the source electrode 105 reacts with the reactive gas and hence, a surface of the electrode 105 becomes rough or a film thickness of the electrode 105 is decreased. Accordingly, in the region of the opening portion 6A of the etching resist 6, a connection resistance of the source electrode is increased. On the other hand, the region DL outside the opening portion 6A is a region where the second insulation film 107 is etched in a retracting manner and hence, a period in which the source electrode 105 is exposed to plasma in the region DL is relatively shorter than a period in which the source electrode 105 is exposed to plasma in the region of the opening 6A. Accordingly, it is possible to avoid damages attributed to plasma by a shortened time whereby the source electrode 105 can maintain the low connection resistance. Due to such a constitution, the outermost peripheral portion constitutes a region having the lowest connection resistance and hence, it is understood that the utilization of this portion for a contact is effective in lowering the connection resistance.

After forming the opening in the second insulation film 107, the etching resist 6 is removed. Then, a third insulation film 108 is formed, for example, by printing or coating a liquid-like organic insulation material to the second insulation film 107 and by drying the liquid-like organic insulation material thereafter. By applying photosensitivity to the organic material per se using an acrylic organic material, for example, the third insulation film 108 may also function as the etching resist 6 at the time of etching the second insulation film 107.

The formation of an opening in the third insulation film 108 is explained in conjunction with FIG. 13 to FIG. 15. The organic insulation material is, as shown in FIG. 13, for example, exposed and etched in a shape such that an outer circumference 108a of the bottom surface of the opening formed in the third insulation film 108 intersects an outer circumference 107a of the bottom surface of the opening formed in the second insulation film 107.

FIG. 14 is a cross-sectional view taken along a line H-H' in FIG. 13, and FIG. 15 is a cross-sectional view taken along a line J-J' in FIG. 13.

FIG. 14 is a portion of the side surface 107b of the opening of the second insulation film 107 which is covered with the third insulation film 108. This portion is formed in a state that the surface of the third insulation film 108 smoothly reaches the source electrode 105. Thereafter, when the pixel electrode 106 is formed over the third insulation film 108, as shown in FIG. 6, the pixel electrode 106 is smoothly connected to the source electrode 105 and hence, disconnection hardly occurs.

FIG. 15 is a portion where the side surface 107b of the opening of the second insulation film 107 is exposed. After a surface of the third insulation film 108 reaches an interface between the third insulation film 108 and the second insulation film 107, this portion passes an edge of the second insulation film 107 and reaches the source electrode 105. Here, out of the exposed region of the source electrode 105 which is exposed on the bottom surface of the opening of the second insulation film 107, in the region DL outside the bottom surface of the opening of the etching resist 6, that is, in the vicinity of the outer circumference of the bottom surface of the opening of the second insulation film 107, damages attributed to a reactive gas, that is, the surface roughness and the like are small. Accordingly, as shown in FIG. 13 and FIG. 15, by partially exposing the side surface 107b of the opening of the second insulation film 107, it is possible to expose the region DL of the source electrode 105 where the damages are small. Accordingly, thereafter, when the pixel electrode 106 is formed over the third insulation film 108, as shown in FIG. 7, it is possible to connect the region DL of the source electrode where the damages are small and the pixel electrode 106 and hence, it is possible to suppress the increase of contact resistance and to reduce the generation of point defects.

In this manner, in an electric device or a display device to which the concept of this embodiment is applied, in connecting the lower conductive layer and the upper conductive layer using the through hole formed in the multi-layered insulation layer, it is possible to suppress the increase of contact resistance. At the same time, it is possible to suppress the occurrence of the disconnection on the side surface of the through hole. Due to such a constitution, it is possible to structurally eliminate the causes lowering a yield rate.

Figure 16:
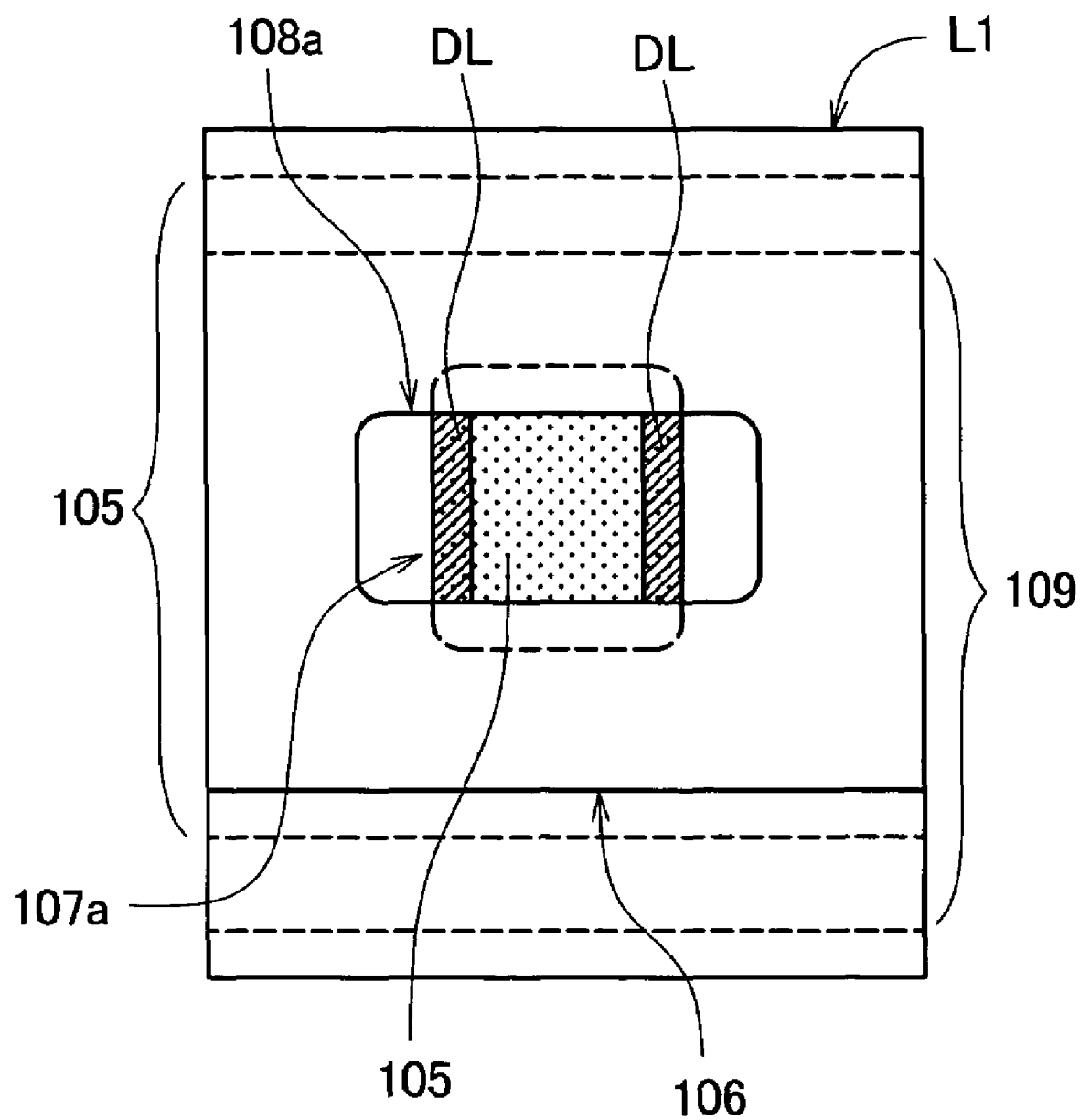
FIG. 16 is an example of a shape of a through hole of the present invention.

Further, a shape of the through hole may be a rectangular shape as shown in FIG. 16. Further, although not shown in the drawing, it is sufficient that the outer circumference 107a of the bottom surface of the opening of the second insulation film 107 and the outer circumference 108a of the bottom surface of the opening of the third insulation film 108 intersect each other and the portion of the side surface 107b of the opening of the second insulation film is covered with the third insulation film 108. Further, it is needless to say that the combination of shapes of the through holes is not limited to the combination of shapes shown in FIG. 5 or FIG. 16 and various kinds of combinations of shapes can be considered.

Although the present invention has been specifically explained heretofore in conjunction with the above-mentioned embodiments, it is needless to say that the present invention is not limited to the above-mentioned embodiments and various modifications can be made without departing from the scope of the present invention.

What is claimed is:

1. A display device which includes:
    a substrate;
    a first conductive layer formed on the substrate; and
    a second conductive layer which is formed on the first conductive layer by way of a first insulation film and a second insulation film; and
    a through hole portion which connects electrically the first conductive layer and the second conductive layer via a through hole of the first and the second insulation film,
    wherein in the through hole portion, the through hole of the first insulation film differs from the through hole of the second insulation film, and
    an outer circumference of the through hole of the first insulating film and an outer circumference of the through hole of the second insulating film have intersection portions.

2. A display device according to claim 1, wherein the substrate which includes a plurality of pixels, and the second conductive layer is constituted of pixel electrodes.

3. A display device according to claim 1, wherein the first insulation film and the second insulation film are made of materials different from each other.

4. A display device according to claim 3, wherein the first insulation film is formed of an inorganic insulation film and the second insulation film is formed of an organic insulation film.

5. A manufacturing method of a display device which includes:
    a step in which insulation films are formed on a first conductive layer which is formed on a substrate, and
    a step in which a second conductive layer is formed on the insulation films and electrically connects the first conductive layer and the second conductive layer via opening portions formed in the insulation films, wherein
    the step which forms the insulation films is constituted of a step in which a first insulation film having a first opening portion is formed in the first conductive layer, and
    a step in which a second insulation film having a second opening portion is formed over the first insulation film in a state that the second opening portion includes a covered portion and an exposed portion of a side surface of the first opening portion.

6. A manufacturing method of the display device according to claim 5, wherein the first opening portion is formed by dry etching.

7. A manufacturing method of the display device according to claim 6, wherein the step which forms the second insulation film having the second opening portion is constituted of a step which applies or prints a material of the second insulation film and a step which forms an opening thereafter.

* * * * *

UNITED STATES PATENT AND TRADEMARK OFFICE
CERTIFICATE OF CORRECTION

PATENT NO. : 7,656,468 B2  Page 1 of 1
APPLICATION NO. : 11/473265
DATED : February 2, 2010
INVENTOR(S) : Ashizawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 797 days.

Signed and Sealed this

Thirtieth Day of November, 2010

David J. Kappos
*Director of the United States Patent and Trademark Office*